United States Patent
Wang et al.

(10) Patent No.: US 8,829,520 B2
(45) Date of Patent: Sep. 9, 2014

(54) THIN FILM TRANSISTOR

(71) Applicant: E Ink Holdings Inc., Hsinchu (TW)

(72) Inventors: Henry Wang, Hsinchu (TW);
Chia-Chun Yeh, Hsinchu (TW);
Xue-Hung Tsai, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/685,638

(22) Filed: Nov. 26, 2012

(65) Prior Publication Data

US 2013/0214269 A1  Aug. 22, 2013

(30) Foreign Application Priority Data

Feb. 16, 2012  (TW) ................. 10105072 A

(51) Int. Cl.
*H01L 29/04* (2006.01)
*H01L 29/417* (2006.01)
*H01L 29/786* (2006.01)

(52) U.S. Cl.
CPC ....... *H01L 29/78693* (2013.01); *H01L 29/7869* (2013.01); *H01L 29/78621* (2013.01); *H01L 29/41733* (2013.01)
USPC ..................................... 257/57; 257/E29.151

(58) Field of Classification Search
CPC .................. H01L 27/14612; H01L 27/14609; H01L 27/14643
USPC .................. 257/57, 223, 257, 290, 291, 292, 257/E29.117, E29.143, E29.152, 72, 443, 257/E29.151
See application file for complete search history.

(56) References Cited

U.S. PATENT DOCUMENTS

| | | | | |
|---|---|---|---|---|
| 6,893,908 | B2 * | 5/2005 | You et al. | 438/155 |
| 8,569,754 | B2 * | 10/2013 | Yamazaki et al. | 257/43 |
| 8,586,425 | B2 * | 11/2013 | Cho et al. | 438/149 |
| 2008/0258143 | A1 | 10/2008 | Kim et al. | |
| 2009/0315026 | A1 | 12/2009 | Jeong et al. | |
| 2010/0025676 | A1 | 2/2010 | Yamazaki et al. | |
| 2010/0025678 | A1 | 2/2010 | Yamazaki et al. | |
| 2011/0127520 | A1 | 6/2011 | You | |

FOREIGN PATENT DOCUMENTS

TW  201131269  9/2011

OTHER PUBLICATIONS

"Office Action of Taiwan Counterpart Application", issued on Jan. 21, 2014, p. 1-p. 6, in which the listed reference was cited.

* cited by examiner

*Primary Examiner* — Quoc Hoang
(74) *Attorney, Agent, or Firm* — Jianq Chyun IP Office

(57) ABSTRACT

A thin film transistor (TFT) includes a gate, a semiconductor layer, an insulating layer, a source, a drain, and a current reduction layer. The insulating layer is disposed between the gate and the semiconductor layer. The source is connected to the semiconductor layer. The drain is connected to the semiconductor layer, and the source and the drain are separated from each other. The current reduction layer has a first part and a second part. The first part is disposed between the semiconductor layer and at least a part of the source, and the second part is disposed between the semiconductor layer and at least a part of the drain.

17 Claims, 4 Drawing Sheets

THIN FILM TRANSISTOR

CROSS-REFERENCE TO RELATED APPLICATION

This application claims the priority benefit of Taiwan application serial no. 101105072, filed on Feb. 16, 2012. The entirety of the above-mentioned patent application is hereby incorporated by reference herein and made a part of this specification.

BACKGROUND OF THE INVENTION

1. Field of the Invention

The invention relates to a thin film transistor (TFT). More particularly, the invention relates to a TFT including a current reduction layer.

2. Description of Related Art

An organic light emitting diode (OLED), with advantages of self-luminescence, no view angle dependence, low power consumption, simple fabrication, low costs, low work temperature range, fast responsive speed, and full colors, has great application potential to be the mainstream illumination light source of the next-generation flat display.

At present, since manufacturers improve and optimize OLED materials, the OLED may be operated under relatively low driving current conditions. Nonetheless, due to the superior electron mobility of the semiconductor layer in the OLED, the manufacturers are forced to increase the channel length of the semiconductor layer to obtain the low current, which compromises the aperture ratio of the OLED device.

What is more, in other types of display panels and photo-detection panels, when the operating voltage or current is reduced due to the improvement of materials or manufacturing processes, the aperture ratio may also be deteriorated.

SUMMARY OF THE INVENTION

The invention is directed to a TFT which may be operated under low current conditions, and the area occupied by the TFT may be effectively reduced.

In an embodiment of the invention, a TFT that including a gate, a semiconductor layer, an insulating layer, a source, a drain, and a current reduction layer is provided. The insulating layer is disposed between the gate and the semiconductor layer. The source is connected to the semiconductor layer. The drain is connected to the semiconductor layer, and the source and the drain are separated from each other. The current reduction layer has a first part and a second part. The first part is disposed between the semiconductor layer and at least a part of the source, and the second part is disposed between the semiconductor layer and at least a part of the drain.

Based on the above, in the TFT described in the embodiments of the invention, the current reduction layer is disposed between the semiconductor layer and at least a part of the source and between the semiconductor layer and at least a part of the drain, so as to reduce the current when the TFT is operated. As such, the TFT is able to be operated under low current conditions, and the operating current can be lowered down without increasing the area occupied by the TFT.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
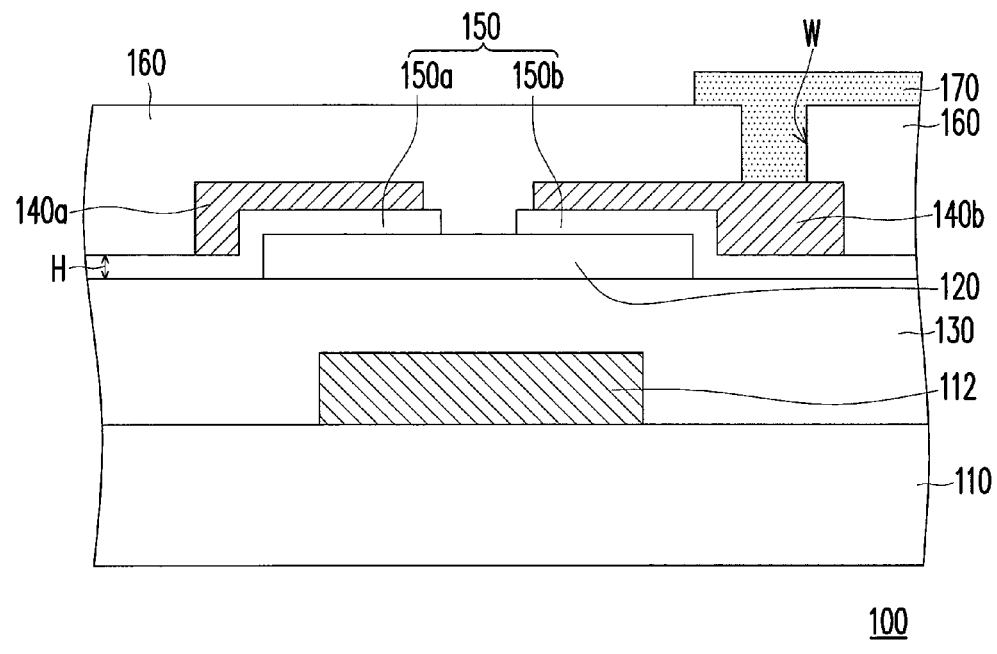
FIG. 1 is a schematic cross-sectional view illustrating a TFT according to an embodiment of the invention.

FIG. 1 is a schematic cross-sectional view illustrating a TFT according to an embodiment of the invention. With reference to FIG. 1, the TFT 100 described in the present embodiment includes a gate 112, a semiconductor layer 120, an insulating layer 130, a source 140a, a drain 140b, and a current reduction layer 150. According to the present embodiment, the gate 112, the source 140a, and the drain 140b are made of metallic materials (e.g., Mo, Al, Ti, etc.), an alloy thereof, or a metal layer in which the aforesaid metallic materials are stacked. The source 140a is connected to the semiconductor layer 120. The drain 140b is connected to the semiconductor layer 120, and the source 140a and the drain 140b are separated from each other.

The semiconductor layer 120 is made of metal oxide semiconductor, for instance. To be more specific, the semiconductor layer 120 is made of indium zinc oxide (IZO), zinc oxide, aluminum doped zinc oxide (AZO), indium gallium zinc oxide (IGZO), or a combination thereof, for instance. When a positive voltage is applied to the conventional OLED for a long time, the threshold voltage may shift. However, in the present embodiment, due to the favorable positive bias stress (PBS) characteristics of the metal oxide semiconductor, the TFT 100 may have a relatively small threshold voltage shift.

The insulating layer 130, for instance, is made of silicon oxide or silicon nitride with a high dielectric constant. In addition, the insulating layer 130 is disposed between the gate 112 and the semiconductor layer 120.

The current reduction layer 150, for instance, serves to reduce the current flowing through the source 140a, the drain 140b, and the channel in the semiconductor layer 120 between the source 140a and the drain 140b. According to the present embodiment, the current reduction layer 150 is made of materials with high dielectric constants, for instance, silicon oxide, aluminum oxide, or a combination thereof. It should be mentioned that the current reduction layer 150 serves to reduce the current amount but does not aim at completely blocking the current. Therefore, in order for the source 140a, the drain 140b, and the semiconductor layer 120 to be sufficiently conductive, the thickness H of the current reduction layer 150 described in the present embodiment ranges from 2 nm to 100 nm, for instance. In an embodiment, the thickness H of the current reduction layer 150 ranges from 5 nm to 50 nm, for instance.

The TFT 100 described in the present embodiment may further include a substrate 110, a passivation layer 160, and a conductive material 170. The gate 112 is disposed between the insulating layer 130 and the substrate 110. The passivation layer 160 covers the source 140a, the semiconductor layer 120, and at least a part of the drain 140b, wherein the passivation layer 160 has a through hole W exposing at least a part of the drain 140b. The conductive material 170 fills the through hole W and covers a part of the passivation layer 160. In the present embodiment, the conductive material 170 is connected to the drain 140b, so as to accomplish electrical connection therebetween.

According to the present embodiment, the current reduction layer 150 has a first part 150a and a second part 150b. The first part 150a is disposed between the semiconductor layer 120 and at least a part of the source 140a, between the source 140a and the insulating layer 130, and between the insulating layer 130 and the passivation layer 160. The second part 150b is disposed between the semiconductor layer 120 and at least a part of the drain 140b, between the drain 140b and the insulating layer 130, and between the insulating layer 130 and the passivation layer 160.

Figure 2:
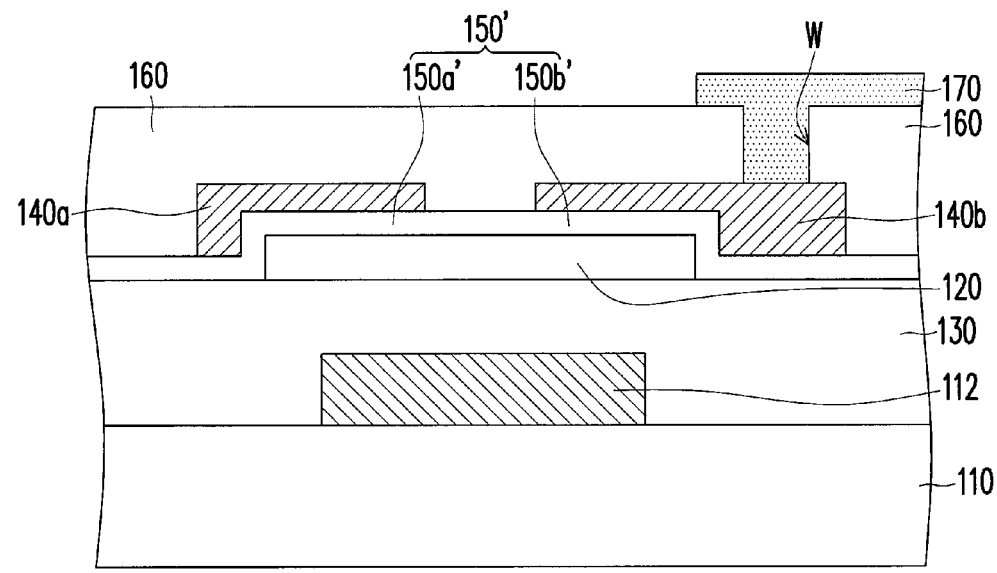
FIG. 2 to FIG. 4 respectively illustrate different arrangements of the current reduction layer in the TFT according to the previous embodiment.
Figure 3:
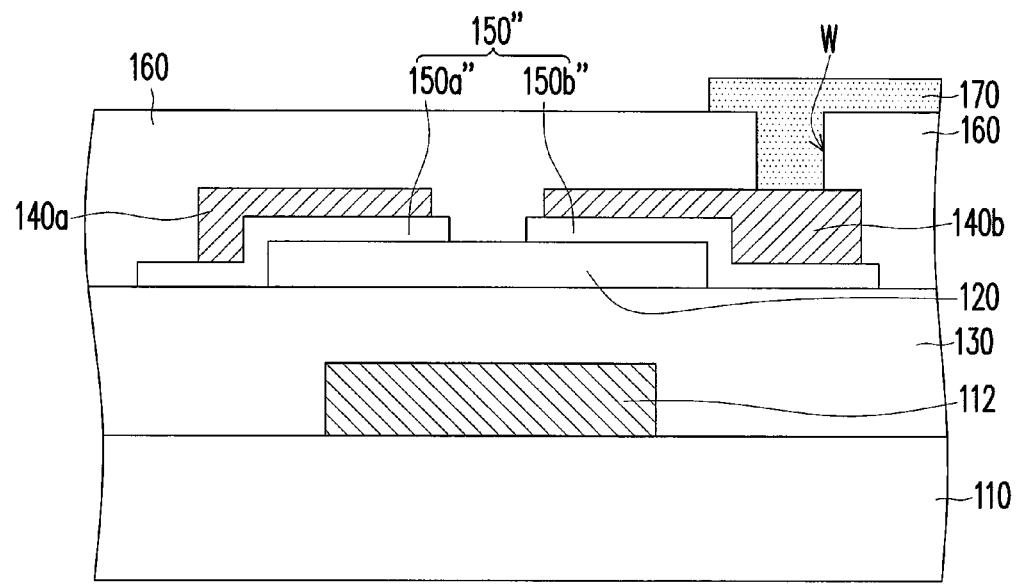
Figure 4:
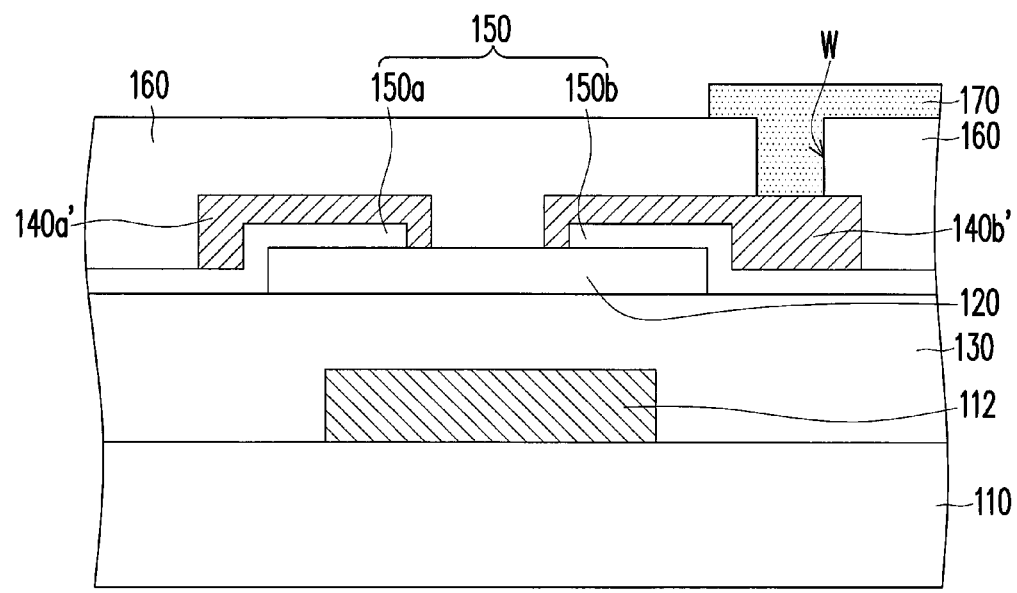

In particular, the first part 150a and the second part 150b in the present embodiment are separated from each other, which should however not be construed as a limitation to the invention. Other arrangements of the current reduction layer are described hereinafter with reference to FIG. 2 to FIG. 4. FIG. 2 to FIG. 4 respectively illustrate different arrangements of the current reduction layer in the TFT according to the previous embodiment.

It should be mentioned that the contact resistance between the semiconductor layer 120 and the source 140 and between the semiconductor layer 120 and the drain 140b can be increased by arranging the current reduction layer 150 between the semiconductor layer 120 and at least parts of the source 140 and the drain 140b. Accordingly, without increasing the semiconductor channel length, the TFT 100 described in the present embodiment is capable of reducing the current amount in an effective manner. Here, since the semiconductor channel is not elongated, the area occupied by the TFT 100 is not expanded. In comparison with the conventional TFT which reduces the current amount by increasing the semiconductor channel length, the TFT 100 described in the present embodiment can both reduce the area occupied by the components in the TFT and reduce the current amount. When the TFT 100 is applied to a display panel, a light emitting device array panel (e.g., an OLED array panel), or a photo-sensitive device array panel, the TFT 100 occupying a relatively small area allows the aperture ratio of these panel to be increased.

With reference to FIG. 2, the TFT 200 described in the present embodiment has the film layers similar to those in the TFT 100 depicted in FIG. 1. Same or similar reference numbers used in the present embodiment and in the previous embodiment represent the same or the like elements, and these elements have similar functions and may be made of similar materials. Accordingly, no further description thereof is provided hereinafter. The difference between the TFT 200 and the TFT 100 rests in that the first part 150a' and the second part 150b' of the current reduction layer 150' are connected to each other. In this embodiment, the first part 150a' and the second part 150b' are integrally formed.

With reference to FIG. 3, the TFT 300 described in the present embodiment has the film layers similar to those in the TFT 100 depicted in FIG. 1. Same or similar reference numbers used in the present embodiment and in the previous embodiment represent the same or the like elements, and these elements have similar functions and may be made of similar materials. Accordingly, no further description thereof is provided hereinafter. The difference between the TFT 300 and the TFT 100 rests in that the current reduction layer 150" may partially cover the insulating layer 130, i.e., the current reduction layer 150" may cover a part of the insulating layer 130. Here, the current reduction layer 150" includes the first part 150a" and the second part 150b" that are separated from each other.

With reference to FIG. 4, the TFT 400 described in the present embodiment has the film layers similar to those in the TFT 100 depicted in FIG. 1. Same or similar reference numbers used in the present embodiment and in the previous embodiment represent the same or the like elements, and these elements have similar functions and may be made of similar materials. Accordingly, no further description thereof is provided hereinafter. The difference between the TFT 400 and the TFT 100 rests in that the source 140a' and the drain 140b' respectively cover one end of the first part 150a and one end of the second part 150b of the current reduction layer 150, and the source 140a' and the drain 140b' are in direct contact with the semiconductor layer 120.

Figure 5:
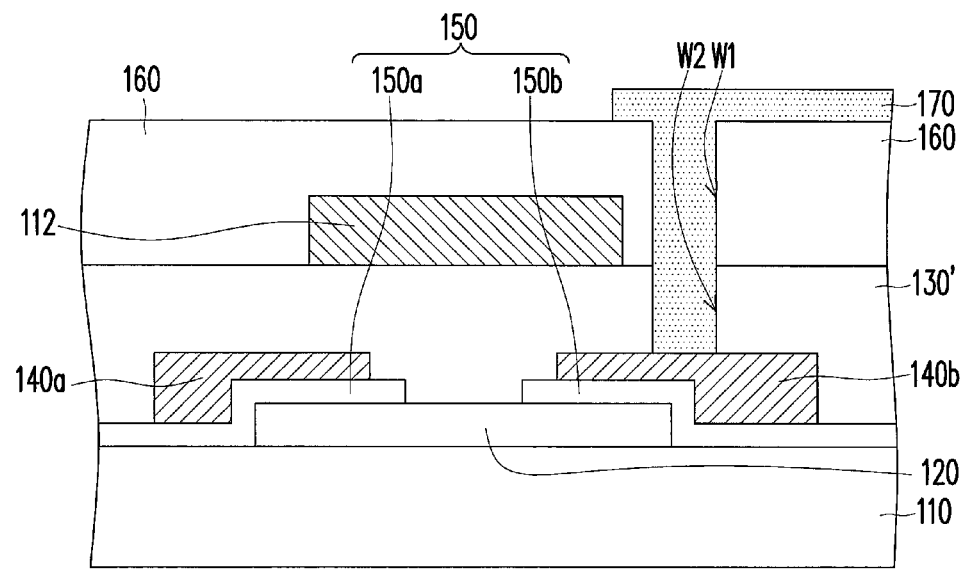
FIG. 5 is a schematic cross-sectional view illustrating a TFT according to another embodiment of the invention.

Certainly, each of the TFTs 100~400 described in the previous embodiments has the bottom-gate structure, while the TFT of the invention may also have the top-gate structure. FIG. 5 is a schematic cross-sectional view illustrating a TFT according to another embodiment of the invention.

With reference to FIG. 5, the TFT 500 described in the present embodiment has the film layers similar to those in the TFT 100 depicted in FIG. 1. Same or similar reference numbers used in the present embodiment and in the previous embodiment represent the same or the like elements, and these elements have similar functions and may be made of similar materials. Accordingly, no further description thereof is provided hereinafter. The difference between the TFT 500 and the TFT 100 lies in the stacking order of the film layers. According to the present embodiment, the first part 150a of the current reduction layer 150 is disposed between the source 140a and the substrate 110 and between the insulating layer 130' and the substrate 110; the second part 150b of the current reduction layer 150 is disposed between the drain 140b and the substrate 110 and between the insulating layer 130' and the substrate 110. The semiconductor layer 120 is disposed between the insulating layer 130' and the substrate 110.

In addition, the TFT 500 described in the present embodiment may further include a passivation layer 160 and a conductive material 170. The passivation layer 160 covers the gate 112 and the insulating layer 130'. Besides, the passivation layer 160 has a first through hole W1, and the insulating layer 130' has a second through hole W2. The first through hole W1 communicates with the second through hole W2, and the first through hole W1 and the second through hole W2 expose at least a portion of the drain 140b. The conductive material 170 fills the first through hole W1 and the second through hole W2 and covers a part of the passivation layer 160. In the present embodiment, the conductive material 170 is in contact with the drain 140b, so as to accomplish electrical connection therebetween.

Figure 6:
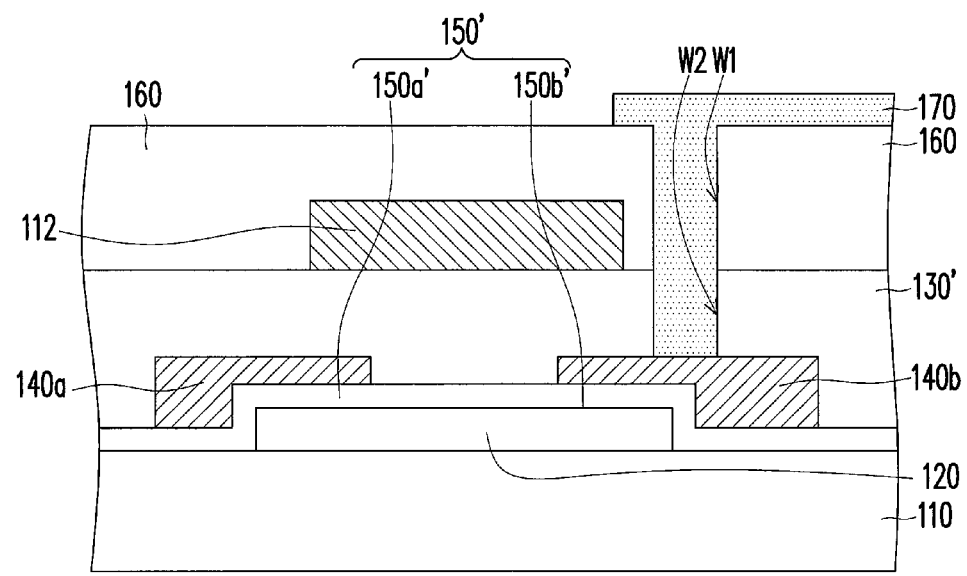
FIG. 6 to FIG. 8 respectively illustrate different arrangements of the current reduction layer in the TFT according to another embodiment of the invention.
Figure 7:
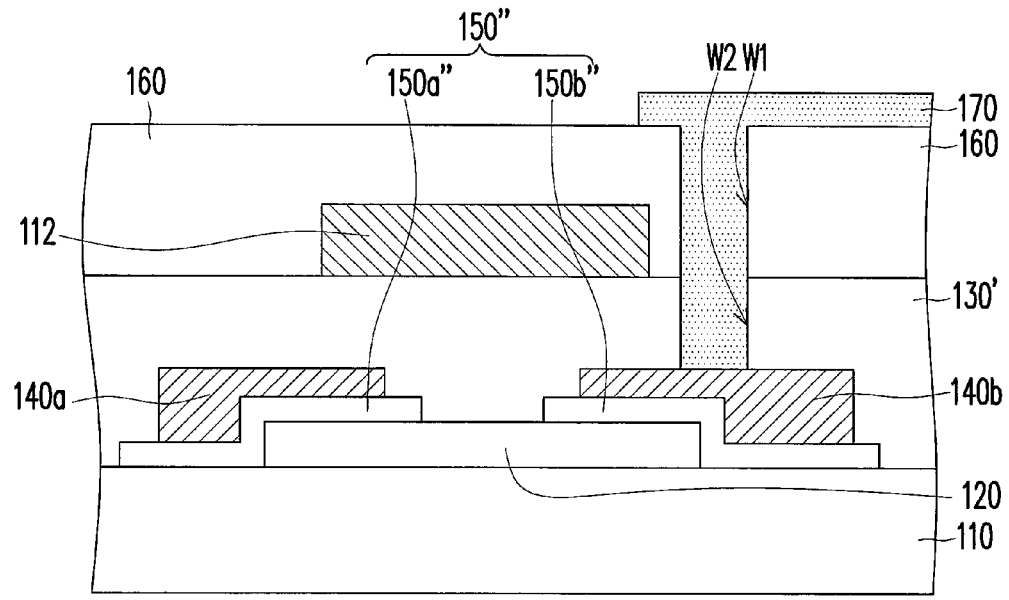
Figure 8:
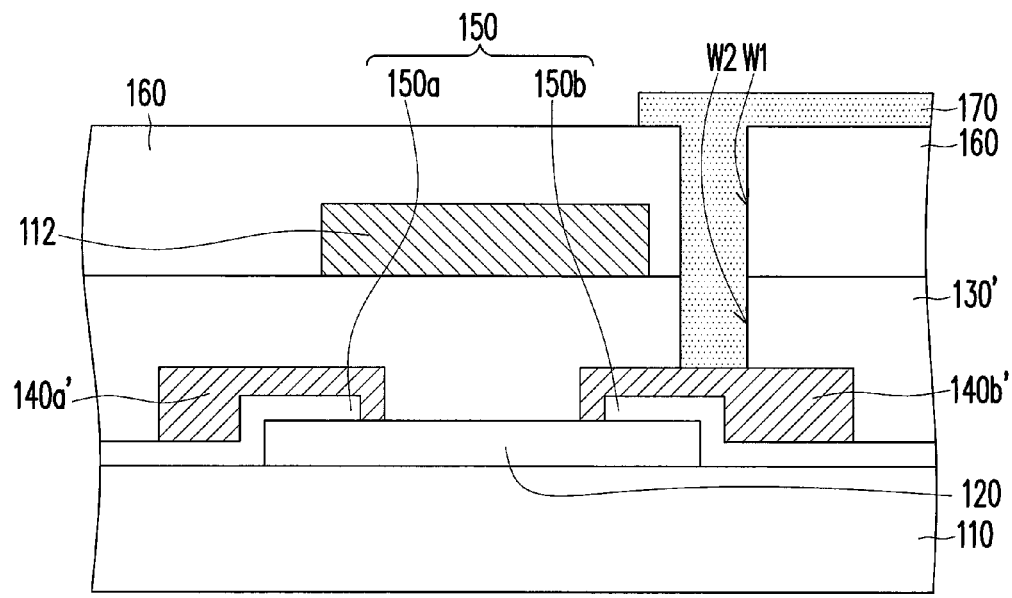

According to the present embodiment, the first part 150a and the second part 150b are separated from each other, which should however not be construed as a limitation to the invention. FIG. 6 to FIG. 8 respectively illustrate different arrangements of the current reduction layer in the TFT according to another embodiment of the invention.

With reference to FIG. 6, the TFT 600 described in the present embodiment has the film layers similar to those in the TFT 500 depicted in FIG. 5. Same or similar reference numbers used in the present embodiment and in the previous embodiment represent the same or the like elements, and these elements have similar functions and may be made of similar materials. Accordingly, no further description thereof is provided hereinafter. The difference between the TFT 600 and the TFT 500 rests in that the first part 150*a*' and the second part 150*b*' of the current reduction layer 150' are connected to each other. In this embodiment, the first part 150*a*' and the second part 150*b*' are integrally formed.

With reference to FIG. 7, the TFT 700 described in the present embodiment has the film layers similar to those in the TFT 500 depicted in FIG. 5. Same or similar reference numbers used in the present embodiment and in the previous embodiment represent the same or the like elements, and these elements have similar functions and may be made of similar materials. Accordingly, no further description thereof is provided hereinafter. The difference between the TFT 700 and the TFT 500 rests in that the current reduction layer 150" may partially cover the substrate 110, i.e., the current reduction layer 150" may cover a part of the substrate 110 and may be located below a part of the insulating layer 130'. Here, the current reduction layer 150" includes the first part 150*a*" and the second part 150*b*" that are separated from each other.

With reference to FIG. 8, the TFT 800 described in the present embodiment has the film layers similar to those in the TFT 500 depicted in FIG. 5. Same or similar reference numbers used in the present embodiment and in the previous embodiment represent the same or the like elements, and these elements have similar functions and may be made of similar materials. Accordingly, no further description thereof is provided hereinafter. The difference between the TFT 800 and the TFT 500 rests in that the source 140*a*' and the drain 140*b*' respectively cover one end of the first part 150*a* and one end of the second part 150*b* of the current reduction layer 150, and the source 140*a*' and the drain 140*b*' are in direct contact with the semiconductor layer 120.

To sum up, in the TFT described in the embodiments of the invention, the current reduction layer is disposed between the semiconductor layer and the source and between the semiconductor layer and the drain, so as to reduce the current amount. In comparison with the conventional TFT which reduces the current amount by increasing the semiconductor channel length, the TFT described in the embodiments of the invention can both reduce the area occupied by the components in the TFT and reduce the current amount. Moreover, since the semiconductor layer is made of metal oxide semiconductor, the TFT described in the embodiments of the invention may have favorable PBS characteristics; namely, the threshold voltage shift phenomenon is relative insignificant.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A thin film transistor comprising:
    a gate;
    a semiconductor layer;
    an insulating layer disposed between the gate and the semiconductor layer;
    a source connected to the semiconductor layer;
    a drain connected to the semiconductor layer, the source and the drain being separated from each other; and
    a current reduction dielectric layer having a first part and a second part, wherein the first part is disposed between the semiconductor layer and at least a part of the source, and the second part is disposed between the semiconductor layer and at least a part of the drain.

2. The thin film transistor as recited in claim 1, wherein the first part and the second part are separated from each other.

3. The thin film transistor as recited in claim 1, wherein the first part and the second part are connected to each other.

4. The thin film transistor as recited in claim 1, wherein the first part is also disposed between the source and the insulating layer, and the second part is also disposed between the drain and the insulating layer.

5. The thin film transistor as recited in claim 1, further comprising:
    a substrate, wherein the gate is disposed between the insulating layer and the substrate;
    a passivation layer covering the source, the semiconductor layer, and at least a part of the drain, wherein the passivation layer has a through hole exposing at least a part of the drain; and
    a conductive material filling the through hole and covering a part of the passivation layer.

6. The thin film transistor as recited in claim 5, wherein the first part is also disposed between the insulating layer and the passivation layer, and the second part is also disposed between the insulating layer and the passivation layer.

7. The thin film transistor as recited in claim 1, further comprising a substrate, wherein the semiconductor layer is disposed between the insulating layer and the substrate.

8. The thin film transistor as recited in claim 7, wherein the first part is also disposed between the source and the substrate, and the second part is also disposed between the drain and the substrate.

9. The thin film transistor as recited in claim 7, wherein the first part is also disposed between the insulating layer and the substrate, and the second part is also disposed between the insulating layer and the substrate.

10. The thin film transistor as recited in claim 7, further comprising:
    a passivation layer covering the gate and the insulating layer, wherein the passivation layer has a first through hole, the insulating layer has a second through hole, the first through hole communicates with the second through hole, and the first through hole and the second through hole expose at least a part of the drain; and
    a conductive material filling the first through hole and the second through hole and covering a part of the passivation layer.

11. The thin film transistor as recited in claim 1, wherein the first part is disposed between the semiconductor layer and a part of the source, another part of the source is in immediate contact with the semiconductor layer, the second part is disposed between the semiconductor layer and a part of the drain, and another part of the drain is in immediate contact with the semiconductor layer.

12. The thin film transistor as recited in claim 1, wherein a material of the current reduction dielectric layer is metal oxide.

13. The thin film transistor as recited in claim 1, wherein a material of the current reduction dielectric layer is silicon oxide, aluminum oxide, or a combination thereof.

14. The thin film transistor as recited in claim 1, wherein a thickness of the current reduction dielectric layer ranges from 2 nm to 100 nm.

15. The thin film transistor as recited in claim 14, wherein a thickness of the current reduction dielectric layer ranges from 5 nm to 50 nm.

16. The thin film transistor as recited in claim 1, wherein a material of the semiconductor layer is metal oxide semiconductor.

17. The thin film transistor as recited in claim 16, wherein the metal oxide semiconductor comprises indium zinc oxide, zinc oxide, aluminum doped zinc oxide, indium gallium zinc oxide, or a combination thereof.

* * * * *